United States Patent [19]

Kaneko et al.

[11] Patent Number: 5,565,699
[45] Date of Patent: Oct. 15, 1996

[54] SEMICONDUCTOR INTEGRATED CIRCUIT DEVICE

[75] Inventors: Satoru Kaneko, Kumagaya; Toshiyuki Ohkoda, Ohra-gun, both of Japan

[73] Assignee: Sanyo Electric Co., Ltd., Osaka, Japan

[21] Appl. No.: 509,749

[22] Filed: Aug. 13, 1995

Related U.S. Application Data

[63] Continuation of Ser. No. 278,135, Jul. 21, 1994, abandoned.

[30] Foreign Application Priority Data

Jul. 22, 1993 [JP] Japan ................................ 5-181564

[51] Int. Cl.$^6$ ............................ H01L 29/76; H01L 29/94; H01L 31/062; H01L 31/113
[52] U.S. Cl. ............................................ 257/379; 257/296
[58] Field of Search ..................................... 257/306, 379, 257/296, 351; 361/313

[56] References Cited

U.S. PATENT DOCUMENTS 4,638,400  1/1987  Brown et al. .
5,083,184  1/1992  Eguchi ........................................ 361/313

FOREIGN PATENT DOCUMENTS 0466016   1/1992   European Pat. Off. .
61-74352  4/1986   Japan .
62-137851 6/1987   Japan .
2-226755  9/1990   Japan .

OTHER PUBLICATIONS

International Electron Devices Meeting Technical Digest, Dec. 1, 1985, D. Brown et al., "Advanced Analog CMOS Technology", pp. 260–263.

*Primary Examiner*—Stephen Meier
*Attorney, Agent, or Firm*—Wenderoth, Lind & Ponack

[57] ABSTRACT

A semiconductor integrated circuit device can prevent a crack in a silicon nitride layer acting as a dielectric thin film of a capacitance element. A lower electrode of a gate polycrystalline silicon is formed on a LOCOS oxide film. A BPSG film is formed as an interlayer insulating film. An opening as well as first and second contact holes surrounding the opening are formed. A silicon nitride film is deposited on the opening and then an upper electrode is formed on the silicon nitride film. A take-out electrode extending out of the first contact hole is in contact with the lower electrode. The first and second contact holes separate the BPSG film into a first portion surrounding the silicon nitride film and a second portion outside the first portion.

9 Claims, 8 Drawing Sheets

SEMICONDUCTOR INTEGRATED CIRCUIT DEVICE

This application is a continuation of now abandoned application, Ser. No. 08/278,135, filed Jul. 21, 1994.

BACKGROUND OF THE INVENTION

1. Field of the Invention

The present invention relates to a semiconductor integrated circuit device which has at least a capacitance element comprising a high dielectric thin film sandwiched with electrode materials and can prevent cracking in the high dielectric thin film.

2. Description of the Related Art

A junction-type capacitor, an MOS-type capacitor, an MIS-type capacitor, and the like are capacitance elements which may be integrated into a semiconductor integrated circuit device. The junction-type capacitor uses a PN-junction capacitance. The MOS-type capacitor uses a silicon oxide film sandwiched between a diffusion region (or lower electrode) and an upper metal electrode. The MIS-type capacitor uses a silicon nitride film having a higher dielectric constant instead of the silicon oxide film. Without using the diffusion region, both the upper and lower electrodes can be made of an electrode wiring material for sandwiching the dielectric thin film there between. This structure can cancel a voltage dependency of a capacitance value because it has no variation in resistance.

FIGS. 7A and 7B show a conventional structure of the capacitance element. FIG. 7A is a plan view showing a structure of the capacitance element described above. FIG. 7B is a cross-sectional view taken along line F—F in FIG. 7A. Referring to FIGS. 7A and 7B, a lower electrode 2 of a polycrystalline silicon film is formed on a LOCOS (local oxidation) oxide film 1 formed on a semiconductor substrate. A silicon nitride film 5 is deposited so as to cover the opening 4 in the interlayer insulating film 3. An upper electrode 6 is formed on the silicon nitride film 5 using a part of an aluminum wiring electrode 3. An aluminum take-out electrode 8 is electrically in contact with the lower electrode 2 via a contact hole 7 in the interlayer insulating film 3. The capacitance element having the above mentioned structure is disclosed, for example, in Japanese laid-open Patent Publication 2-226755.

For the latest semiconductor integrated circuit devices, a smoothing technique is indispensably adopted for smoothing steps formed on a surface to establish high density electrode wiring. A reflowing process of an interlayer insulating film is one of the most typical smoothing techniques. Boron-phosphosilicate glass (BPSG) has been widely used as a reflowing material. In this technique, a BPSG film is heated, and then thermally softened to absorb the underlying steps so that the shape of an opening is smoothed. In order to integrate a capacitance element using the reflowing technique, a silicon nitride film 5 is deposited onto the opening 4 formed in the BPSG film.

However, it has been apparent that a boron-phosphosilicate glass (BPSG) film used as the interlayer insulating film 3 causes a crack 9 in the silicon nitride film 5 positioned at the bottom of the opening 4, and thus frequently causes electrical short circuits between the upper electrode 6 and the lower electrode 2.

The inventors of the present invention have made a study on the causes of such short circuits, and it has been discovered that the cracking occurs when the silicon nitride film 5 is deposited, but does not occurs during the thermal process after the deposition of the silicon nitride film 5.

Normally, the deposition temperature of the silicon nitride film 5 in a LPCVD process ranges from 700° C. to 800° C. The reflow temperature of a BPSG film is about 900° C. Hence, it is considered that the BPSG film is unaltered in shape at the deposition temperature of the silicon nitride film 5.

However, it is considered that since a thermal expansion coefficient of the BPSG film is substantially different from the silicon nitride 5, the BPSG film is excessively deformed by an effect of a stress in the direction of the arrow 10 (shown in FIG. 7B) which is applied from the silicon nitride film 5 to the BPSG film 3, in addition to the reduction force of the BPSG film 3. It is inferred that since the BPSG film 3 is excessively deformed, a stress is applied to the silicon nitride film 5, which causes the crack 9.

SUMMARY OF THE INVENTION

The present invention was developed in order to overcome the above mentioned technical problems. The present invention provides a capacitance element with a novel structure that can prevent the cracking in a silicon nitride film by substantially dividing a BPSG film around the silicon nitride film into a silicon nitride surrounding portion and a region adjacent to the former portion.

According to the present invention, as illustrated in FIG. 1 and 2A–2B, the silicon nitride film 15 is separated from the ambient BPSG film 13, so there is minimum direct contact between the BPSG film 13a and the silicon nitride film 15. The degree of the deformation of the BPSG film 13 depends on its volume. A BPSG film with a smaller volume results in smaller deformation. Hence, the silicon nitride film 15 is subjected to a small stress, thereby preventing the formation of a crack in the silicon nitride film 15. This and other objects of the present invention will become apparent from the following drawings and detailed description taken in connection with the drawings.

DETAILED DESCRIPTION OF THE PRESENT INVENTION AND PREFERRED EMBODIMENTS

Preferred embodiments according to the present invention will be explained below in detail with reference to the attached drawings.

Figure 1:
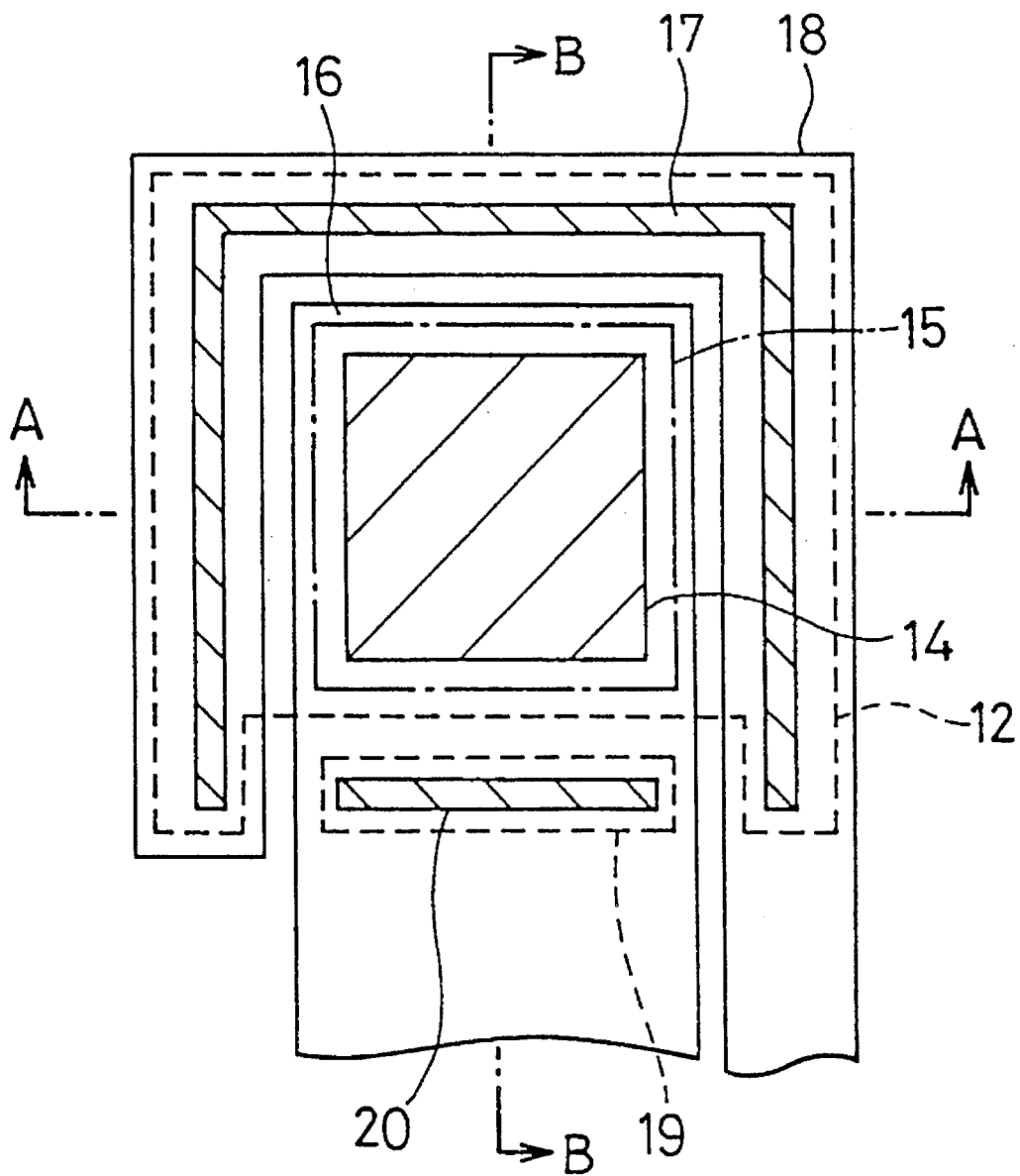
FIG. 1 is a plan view showing a capacitance element built in a semiconductor integrated circuit device according to the first embodiment of the present invention.
Figure 2A:
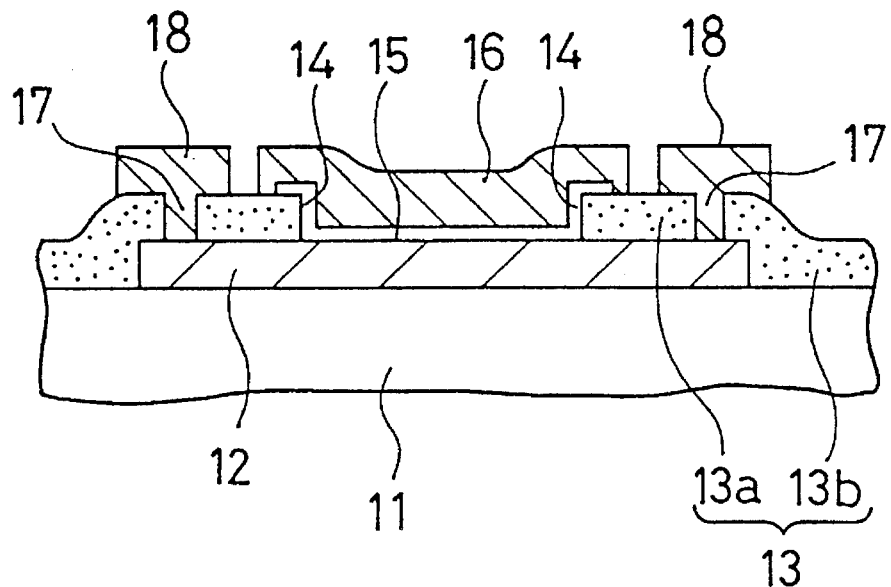
FIG. 2A is a cross-sectional view taken along line A—A in FIG. 1.
Figure 2B:
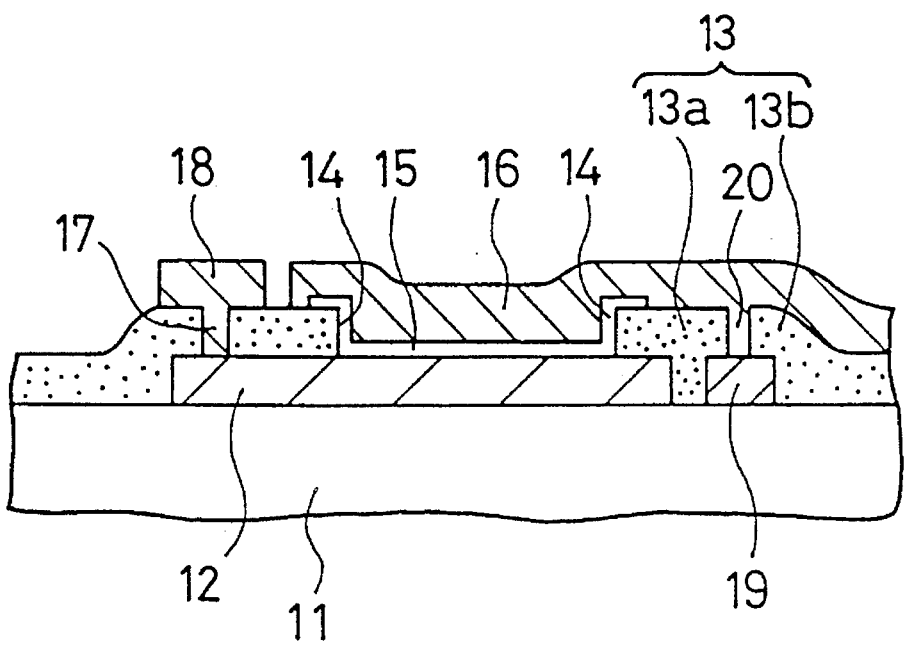
FIG. 2B is a cross-sectional view taken along line B—B in FIG. 1.

FIG. 1 is a plan view showing a semiconductor integrated circuit device, especially a capacitance element integrated therein, according to the first embodiment of the present invention. FIG. 2A is a cross-sectional view taken along line A—A of FIG. 1. FIG. 2B is a cross-sectional view taken along line B—B of FIG. 1.

Referring to these figures, a LOCOS oxide film 11 used for an element isolation is formed on a surface of a semiconductor substrate or epitaxial layer according to a selective oxidizing process. A lower electrode 12 or one electrode of a capacitance element which is made of a polycrystalline silicon material is formed on the LOCOS oxide film 11. A BPSG film 13 acting as an interlayer insulating film is formed over the LOCOS oxide film 11 and the lower electrode 12. An opening 14 is formed in the BPSG film 13 to expose a surface of the lower electrode 12.

A silicon nitride film 15 acting as a dielectric thin film of a capacitance element is coated over the lower electrode 12 so as to cover the opening 14. The silicon nitride film 15 extends to the surface of the BPSG film 13 around the opening 14.

An upper electrode 16 acting as the other electrode of the capacitance element is formed of a first level aluminum electrode wiring layer so as to cover the silicon nitride film 15. The upper electrode 16 extends over the BPSG film 13 to be connected electrically to other circuit elements. A first contact hole 17 opens in the BPSG film 13 so as to surround the silicon nitride film 15 except the extending upper electrode 16. The take-out electrode 18 derived from the lower electrode 12 is formed of the first level aluminum electrode wiring layer and is contacted with the lower electrode 12 via the first contact hole 17. The take-out electrode 18 extends over the BPSG film 13 to be connected electrically to other circuit elements.

A dummy electrode 19 electrically isolated from the lower electrode 12 is formed on the LOCOS oxide film 11. The dummy electrode 19 is made of the polycrystalline silicon material and is arranged underneath the extending upper electrode 16. A second contact hole 20 is open in the BPSG film 13 overlying the dummy electrode 19. The upper electrode 16 is in contact with the dummy electrode 19 via the second contact hole 20. As the dummy electrode 19 is isolated from the lower electrode 12, the first and second contact holes 17 and 20 are discontinuously arranged each other to ensure an electrical isolation between the upper electrode 16 and the lower electrode 12.

Both the first and second contact holes 17 and 20 surround nearly completely the silicon nitride film 15. This structure separates the BPSG film 13 into the first portion 13a surrounding the silicon nitride film 15 and second the portion 13b extending outwards. Hence the BPSG film 13a of the first portion surrounding the silicon nitride film 15 has far less volume than the second portion 13b, because it is located between the opening 14 and the first and second contact holes 7 and 20.

Figure 3A:
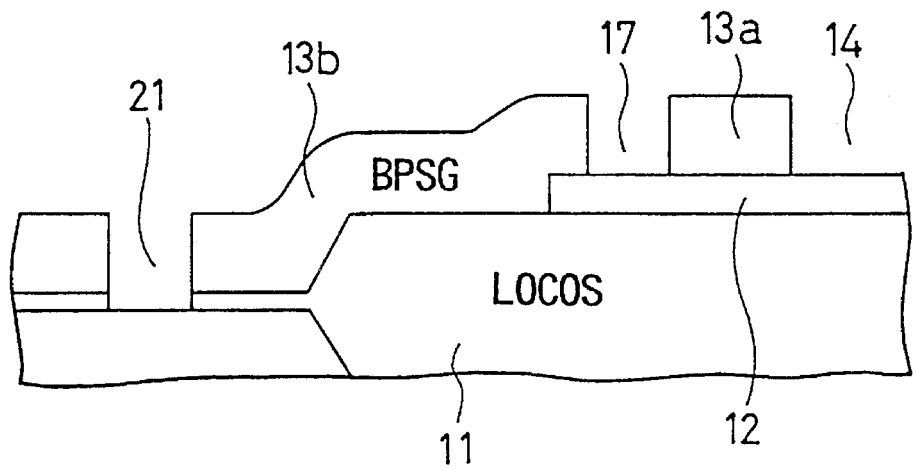
FIG. 3A is a cross-sectional view showing a capacitance element after making contact holes in a BPSG film.
Figure 3B:
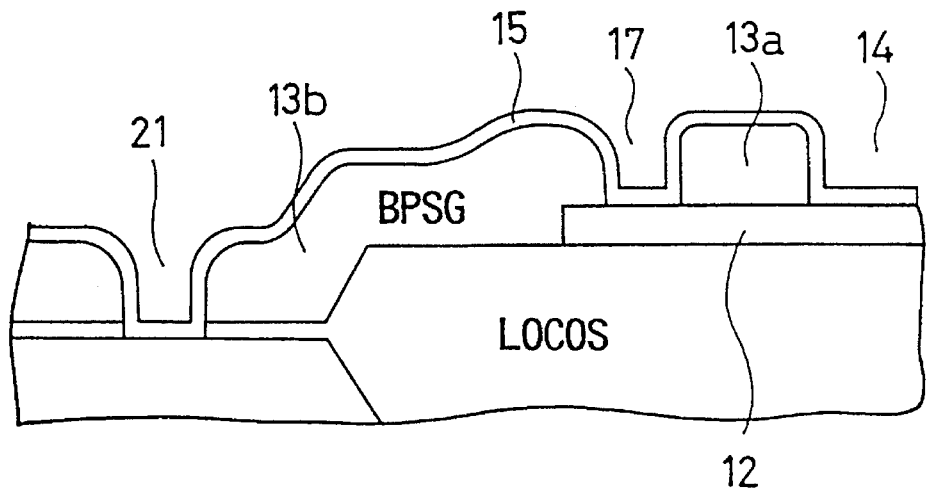
FIG. 3B is a cross-sectional view showing a capacitance element after depositing a silicon nitride film on a BPSG film.
Figure 3C:
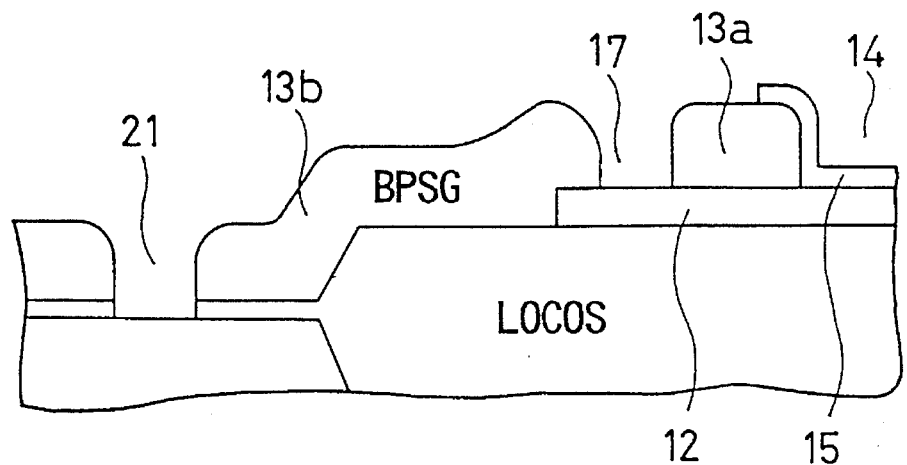
FIG. 3C is a cross-sectional view showing a capacitance element after etching a part of silicon nitride film.

FIGS. 3A to 3C are cross-sectional views each showing a deformation process of the BPSG film 13. FIG. 3A shows the step before the silicon nitride film 15 is deposited. FIG. 3B shows a step after the silicon nitride film 15 has been deposited. FIG. 3C shows a step after the silicon nitride film has been patterned. The BPSG film 13 is formed by a normal pressure CVD method and then is immediately subjected to a thermal process of about 900° C. to reflow. This reflow process smoothes the surface of the step of the underlying layer. In the following photo etching process, the opening 14 for a capacitance element, the first and second contact holes 17 and 20, and the contact holes 21 for other elements are open in the BPSG film 13. The contact holes may be formed through a dry anisotropic etching, or a two-step etching including an anisotropic etching and an isotropic etching. Sequentially, the edge of the contact hole 21 in the BPSG film 13, as shown in FIG. 3B, is smoothly formed by depositing the silicon nitride film 15 by a LPCVD method.

Since the reflow temperature of the BPSG film 13 is about 900° C., the deposition process temperature where the silicon nitride film 15 is deposited at 700° to 800° C. for several minutes, is hard to reflow the BPSG film 13. The silicon nitride film 15 deposited at 700° to 800° C., and a difference in temperature coefficient between the silicon nitride film 15 and the BPSG film 13, results to reflow more excessively in the BPSG film. Next, the silicon nitride film 13, as shown in FIG. 3C, is patterned in the form of a dielectric thin film for a capacitance element.

The amount of the deformation of the BPSG film 13 during the deposition of the silicon nitride film 15 depends on the volume of the BPSG film 13. In other words, the smaller the volume, the smaller the deformation, and the larger the volume, the larger the deformation. It is inferred that a change per unit volume of the BPSG film 13 is nearly constant. Therefore, in comparison with a change of the contact hole 21 around which a large amount of the BPSG film 13b exists, the opening 14 around which has only a small volume of the BPSG film 13a deforms very slightly. The small change in shape of the BPSG film 13a results in a small stress applied to the adjacent silicon nitride film 15 coated along the opening 14, thus preventing a crack occurring in the silicon nitride film 15.

Figure 4A:
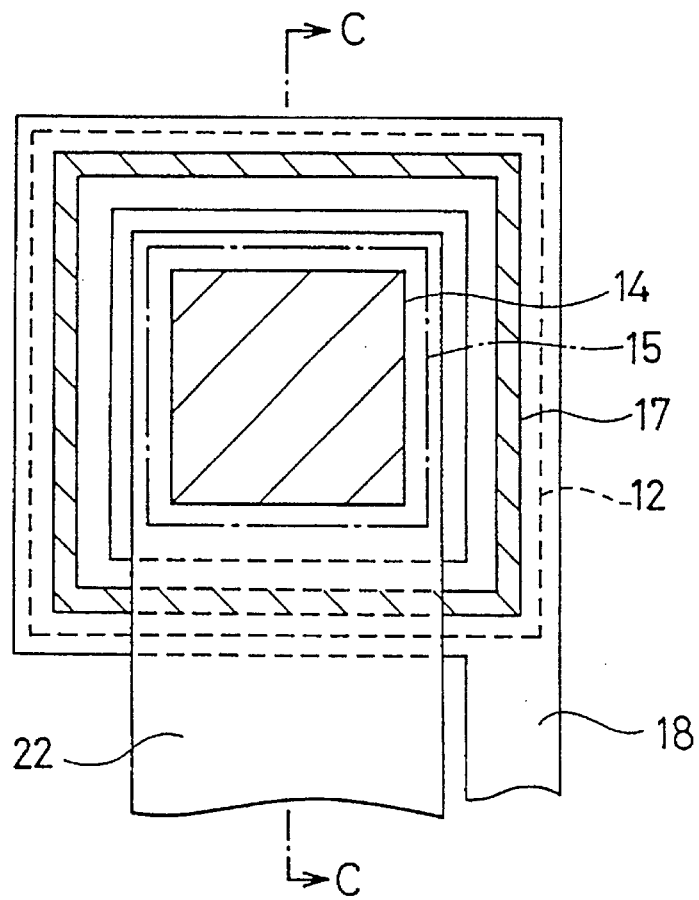
FIG. 4A is a plan view used for explaining the second embodiment of the present invention.
Figure 4B:
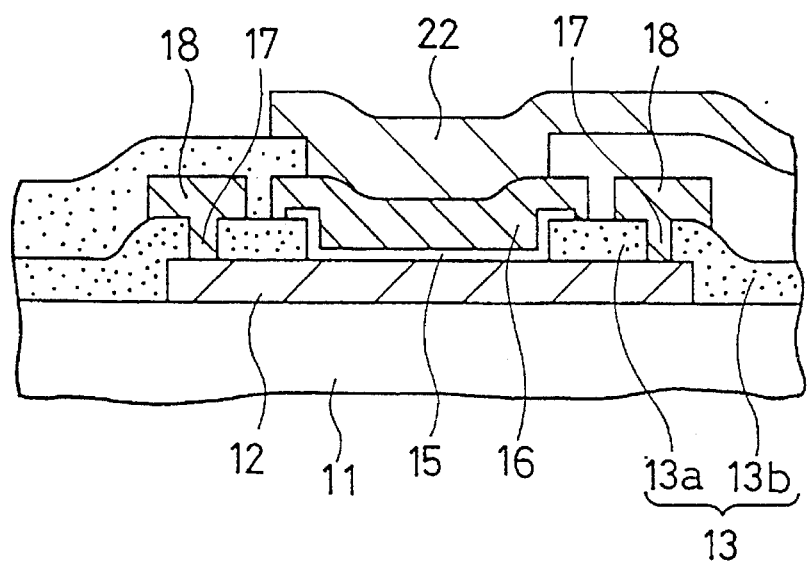
FIG. 4B is a cross-sectional view taken along line C—C in FIG. 4A.

FIGS. 4A and 4B show a second embodiment according to the present invention. FIG. 4A is a plan view of the second embodiment of a capacitance element. FIG. 4B is a cross-sectional view of the capacitance element taken along line C—C in FIG. 4A. The same reference numerals are attached to the elements which corresponds to the same elements in the first embodiment shown in FIG. 1, FIG. 2A and FIG. 2B. In the first embodiment, the take-out electrode 18 of the lower electrode 12 and the upper electrode 16 are both formed of an aluminum wiring of the same layer, and the first and second contact holes 17 and 20 are separated from each other. Hence, the portion at which the BPSG film 13 cannot be separated may occur inevitably. According to the present embodiment, the upper electrode 16 is taken via the take-out electrode 22 of the second level aluminum wiring layer as shown in FIG. 4A and FIG. 4B. Since an interlayer isolation can be formed between the take-out electrode 22 for the upper electrode 16 and the take-out electrode 18 for the lower electrode 12, the first contact hole 17 can be continuously formed around the entire periphery of the silicon nitride film 15.

Figure 5A:
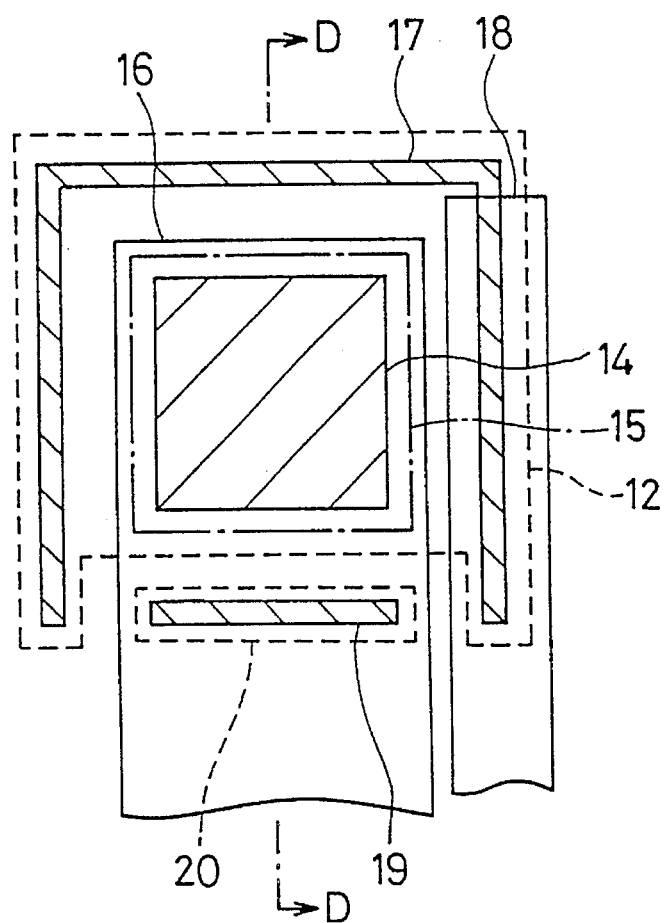
FIG. 5A is a plan view used for explaining the third embodiment of the present invention.
Figure 5B:
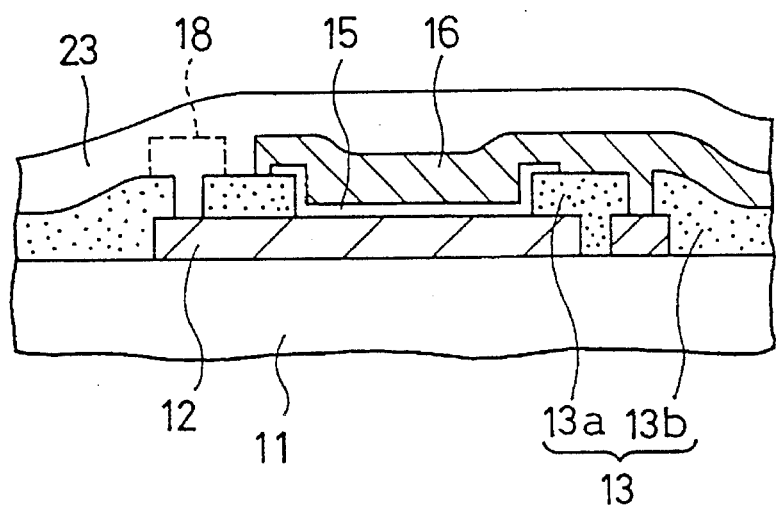
FIG. 5B is a cross-sectional view taken along line D—D in FIG. 5A.

FIGS. 5A and 5B show the third embodiment of the present invention. FIG. 5A is a plan view of a capacitance element according to the third embodiment. FIG. 5B is a cross-sectional view of a capacitance element taken along line D—D in FIG. 5A. Referring to the first and second embodiments, the lower electrode 12 and the take-out electrode 18 are nearly in contact with the entire periphery of the silicon nitride film 15. The contact along the entire periphery can reduce the resistance component of the lower electrode 12. According to the present embodiment, in the case that the lower electrode 12 has very low resistance component, then the take-out electrode 18 is not necessary to contact to the all peripherals of the lower electrode 12. As shown in FIG. 5B, the remaining portion of the first contact hole 17, at which the take-out electrode does not exist, is buried under the BPSG film 23 which is formed after formation of the upper electrode 16.

Figure 6A:
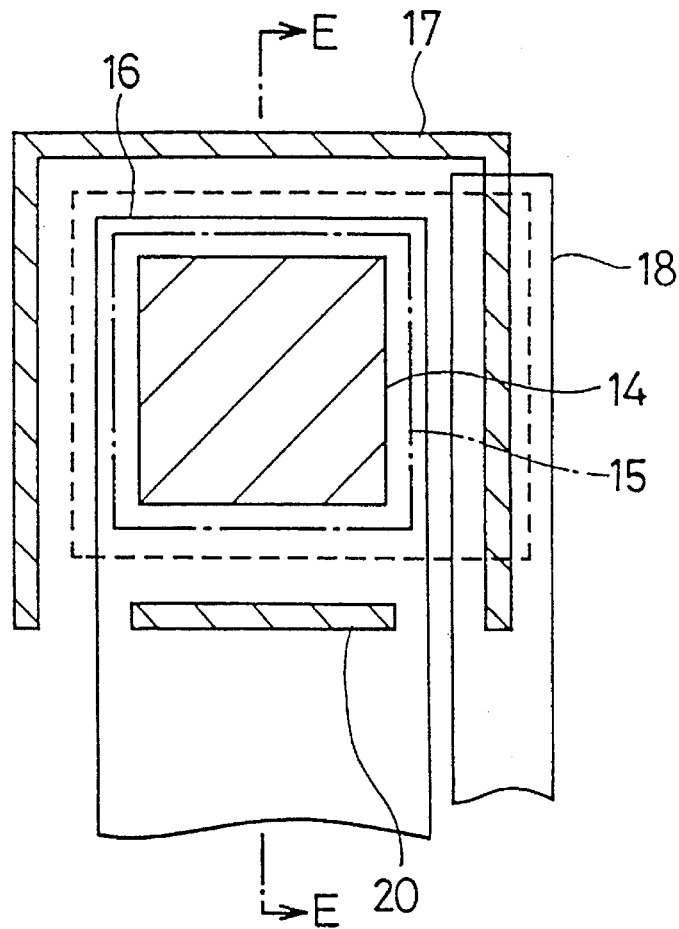
FIG. 6A is a plan view used for explaining the fourth embodiment of the present invention.
Figure 6B:
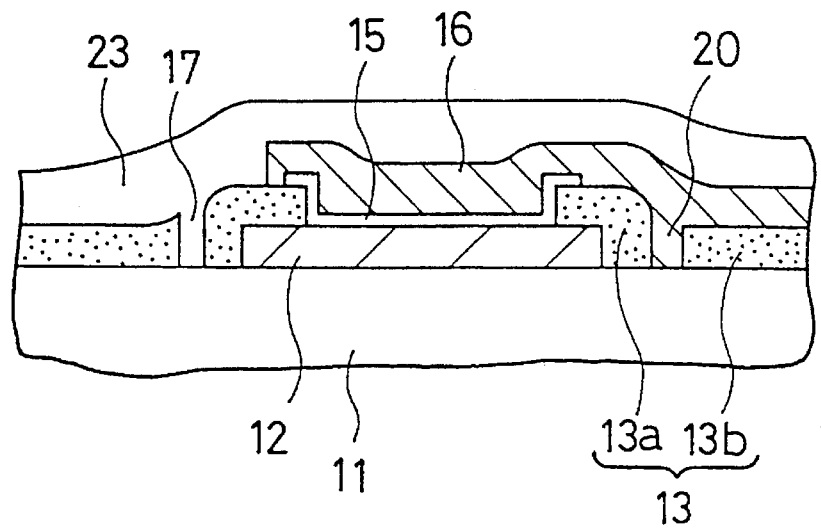
FIG. 6B is a cross-sectional view taken along line E—E in FIG. 6A.
Figure 7A:
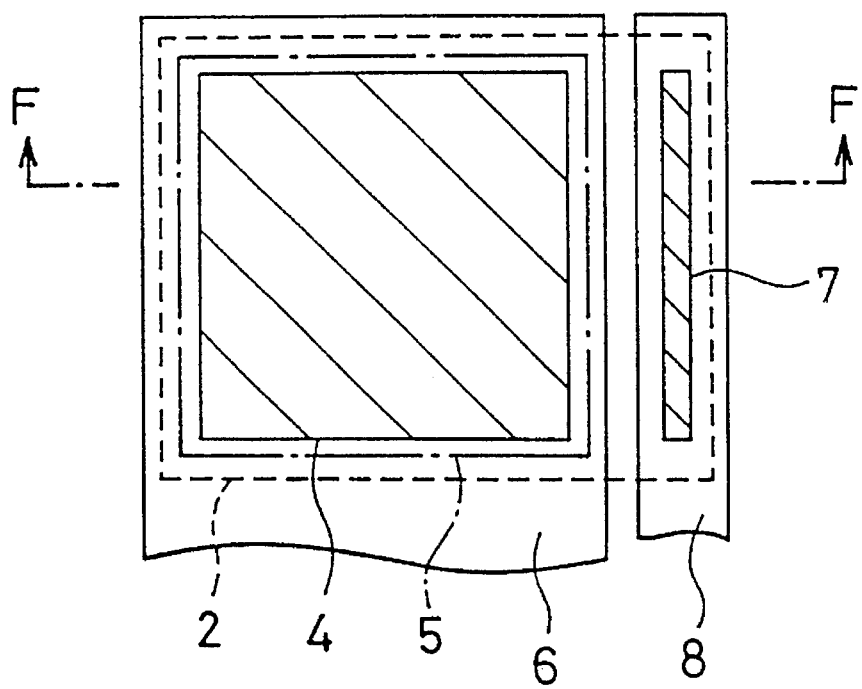
FIG. 7A is a plan view of a conventional capacitor element in a semiconductor integrated circuit device.
Figure 7B:
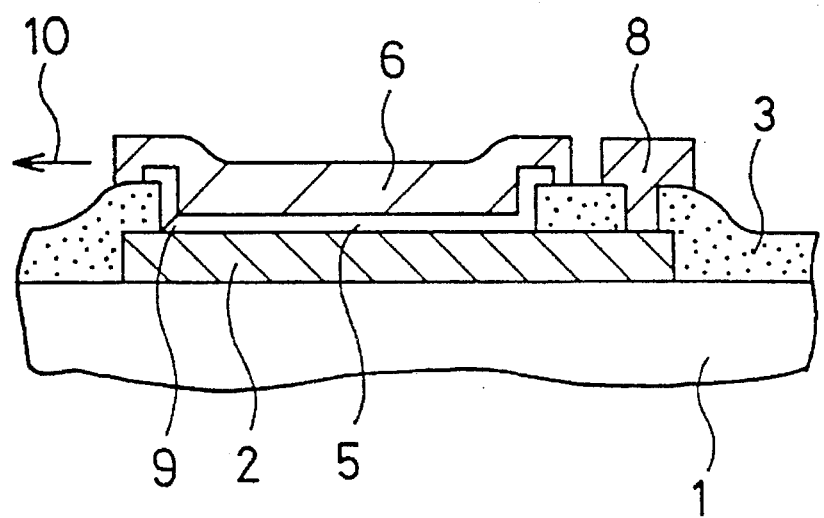
FIG. 7B is a cross-sectional view taken along line F—F in FIG. 7A.

FIGS. 6A and 6B show the fourth embodiment according to the present invention. FIG. 6A is a plan view of a capacitance element of the present embodiment. FIG. 6B is a cross-sectional view of a capacitance element taken along line E—E in FIG. 6A. In the first to third embodiments, both the lower electrode 12 and the dummy electrode 19 are arranged underneath the first and second contact holes 17 and 20, so as to terminate the etching process of the BPSG film 13 at the polycrystalline silicon layer. In addition to the function for the etching termination, the dummy electrode 19 under the second contact hole 20 has a roll to keep the upper electrode 16 flat to prevent disconnection of the electrode 16 thereof. If the manufacturing process is allowable concerning the above mentioned requirements, the lower electrode 12 and dummy electrode 19 can be removed from under the first and second holes 17 and 20 as shown in FIG. 6B, except the portion where the take-out electrode 18 is contacted. A smaller lower electrode 12 can reduce an area occupied by the capacitance element by the amount reduced.

As described above, according to the present invention, arranging the first and second contact holes 17 and 20 in the BPSG film 13 around the silicon nitride film 15 causes a separation of the BPSG film 13a and 13b. Then the volume of the BPSG film 13a which contacts to the silicon nitride film 15 becomes small, thus decreasing the deformation of the BPSG film 13 which occurs at a deposition time of the silicon nitride film 15. Hence, since the stress which occurs in the silicon nitride film 15 deposited along the shape of the opening 14 of the BPSG film 13a becomes small, the occurrence of a crack in the silicon nitride film 15 can be prevented.

Figure 8A:
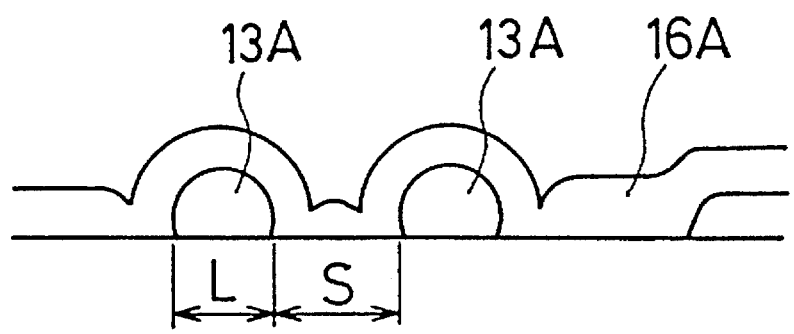
FIG. 8A is a cross-sectional view showing the shape of the contact holes by conventional thermal reflowing.
Figure 8B:
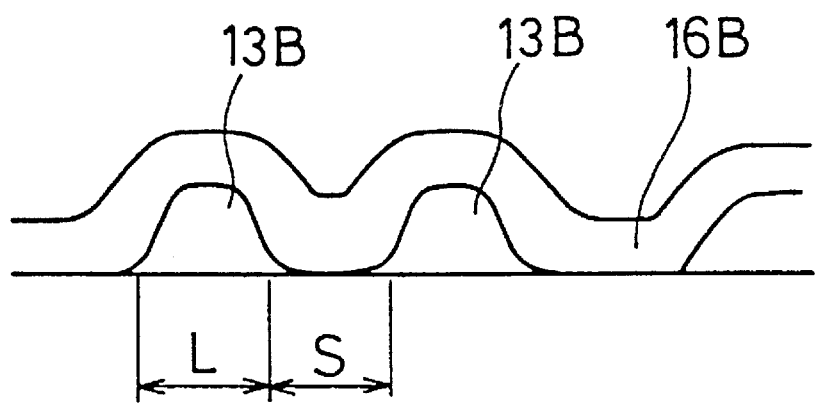
FIG. 8B is a cross-sectional view showing the shape of the contact holes by nitride film covering (reflowing) according to an embodiment of the present invention.

Moreover, the above-mentioned nitride film reflowing process, by which the shape of the contact holes in the BPSG film 13 is varied during deposition time of the silicon nitride film 15, can provide a good step coverage when an electrode of metal such as aluminum is formed at contact holes in the BPSG film 13, thus preventing, effectively, a disconnection of a metal electrode at the edge of the contact holes. This effect will be explained below with reference to FIGS. 8A and 8B. FIG. 8A shows a variation in shape of contact holes in the BPSG film by a conventional thermal reflowing process. FIG. 8B shows a variation in shape of contact holes in the BPSG film during the nitride film reflowing process according to the embodiment of the present invention. As shown in FIG. 8A, in the case of the BPSG film portion (L) and the opening (S) each having a narrower pattern (for example, L/S=1.6 μm /1.6 μm), the conventional thermal reflowing process causes swelling of the BPSG film 13A (shown in Figure), resulting in extreme degradation of the step coverage of the metal electrode 16A. On the other hand, the nitride film reflowing process, as shown in FIG. 8B, can smooth the BPSG film portion 13B even if each of the BPSG film portion (L) and the opening (S) has a narrow pattern width (for example, L/S=1.6 μm /1.6 μm). As a result, the step coverage of the metal electrode 16B can be improved.

Both the dummy electrode 19 and the second contact hole 20 are arranged so as to divide substantially the BPSG film 13a surrounding the silicon nitride film 15, although both the upper electrode 16 and the take-out electrode 18 are formed of the same wiring electrode layer. Moreover, the take-out electrode 18 can be contacted substantially to the entire portion on which the first contact hole 17 is formed, to reduce the resistance component of the lower electrode 12.

According to the second embodiment, the BPSG film 13 can be separated so as to surround the entire circumference around the silicon nitride film 15 by using a multilevel metalization technique.

According to the third embodiment, since the take-out electrode 18 is partially contacted to the lower electrode 12, the area occupied by aluminum wiring electrode can be reduced. According to the fourth embodiment, since the areas of both the lower electrode 12 and the take-out electrode 18 can be reduced, the area occupied by a capacitance element can be further reduced.

The present invention should not be restricted to a capacitance element, which adopts a BPSG film 13 as an interlayer insulating film. Other kinds of insulating film which can be deformed due to the silicon nitride film 15 deposited thereon can be applicable.

While a semiconductor integrated circuit device which has a capacitor element, has been described by way of example, the principles of the present invention are also applicable to a wide range of capacitor elements on a semiconductor device.

Although a certain preferred embodiment of the present invention has been shown and described in detail, it should be understood that various changes and modifications may be made therein without departing from the scope of the appended

What is claimed is:

1. A semiconductor integrated circuit device comprising:
   a lower electrode formed on an insulating film lying on a surface of a semiconductor chip, said lower electrode being of a conductive material;
   an interlayer insulating film covering said lower electrode;
   an opening having a plurality of sides forming a periphery thereof and formed in said interlayer insulating film to expose a surface of said lower electrode;
   a dielectric thin film of a high dielectric material coated on said opening and extending to a surface of said interlayer insulating film around said opening;
   an upper electrode formed on said dielectric thin film, said upper electrode being formed of a conductive material;
   a take-out electrode for said lower electrode, said take-out electrode being in contact with said lower electrode;
   at least one contact hole formed in said interlayer insulating film separating said interlayer insulating film into two portions, a first portion contacting said dielectric thin film inside of said at least one contact hole, and a second portion surrounding said first portion but without being in contact with said first portion separated by said at least one contact hole; and said contact hole extending parallel to each side of said opening and surrounding all sides of said opening.

2. A semiconductor integrated circuit device according to claim 1, wherein said at least one contact hole extends continuously along all sides of said opening to completely surround said opening.

3. A semiconductor integrated circuit device according to claim 1, wherein said at least one contact hole extends discontinuously along all sides of said opening to completely surround said opening.

4. A semiconductor integrated circuit device according to claim 1, wherein said dielectric thin film comprises a silicon nitride thin film.

5. A semiconductor integrated circuit device according to claim 1, wherein said interlayer insulating film comprises a boron-phosphosilicate glass (BPSG) film.

6. A semiconductor integrated circuit device comprising:

a lower electrode formed on an insulating film lying on a surface of a semiconductor chip, said lower electrode being of a conductive material;

an interlayer insulating film covering said lower electrode;

an opening formed in said interlayer insulating film to expose a surface of said lower electrode;

a dielectric thin film of a high dielectric material coated on said opening;

an upper electrode formed on said dielectric thin film, said upper electrode being formed of a conductive material;

a first contact hole formed in said interlayer insulating film lying on said lower electrode;

a take-out electrode for said lower electrode, said take-out electrode being in contact with said lower electrode via said first contact hole;

a second contact hole formed in said interlayer insulating film, being located apart from said contact hole, wherein said first contact hole and said second contact hole surround a periphery of said dielectric thin film;

said first contact hole being filled with said conductive material of said take-out electrode, separating a first portion of interlayer insulating film disposed inside of said first contact hole from a second portion of said interlayer insulating film disposed outside of said first contact hole;

said second contact hole being filled with said conductive material of said upper electrode, separating said first portion of said interlayer insulating film disposed inside of said first contact hole from said second portion of said interlayer insulating film disposed outside of said second contact hole; and said interlayer insulating film being separated into two portions, said first portion surrounding said periphery of dielectric thin film and said second portion surrounding said first portion.

7. A semiconductor integrated circuit device according to claim 6, further comprising:

a dummy electrode, underlying said second contact hole and electrically isolated from said lower electrode, wherein said second contact hole is formed on said dummy electrode.

8. A semiconductor integrated circuit device according to claim 7, wherein said upper electrode is in contact with said dummy electrode via said second contact hole.

9. A semiconductor integrated circuit device according to claim 6, wherein said periphery of said dielectric thin film has four sides and wherein said first contact hole surrounds three sides of said periphery of said dielectric thin film, and said second contact hole surrounds a fourth side of said periphery of said dielectric thin film.

* * * * *